United States Patent
Lai et al.

(10) Patent No.: US 7,816,661 B2
(45) Date of Patent: Oct. 19, 2010

(54) AIR CELL THERMAL ISOLATION FOR A MEMORY ARRAY FORMED OF A PROGRAMMABLE RESISTIVE MATERIAL

(75) Inventors: Erh-Kun Lai, Longjing Shiang (TW); ChiaHua Ho, Kaohsiung (TW); Kuang Yeu Hsieh, Jhubei (TW)

(73) Assignee: Macronix International Co., Ltd., Hsinchu (TW)

( * ) Notice: Subject to any disclaimer, the term of this patent is extended or adjusted under 35 U.S.C. 154(b) by 807 days.

(21) Appl. No.: 11/562,122

(22) Filed: Nov. 21, 2006

(65) Prior Publication Data

US 2008/0266940 A1    Oct. 30, 2008

Related U.S. Application Data

(60) Provisional application No. 60/739,089, filed on Nov. 21, 2005.

(51) Int. Cl.
*H01L 21/06* (2006.01)
*H01L 47/00* (2006.01)

(52) U.S. Cl. .................. 257/4; 257/2; 257/3; 257/5; 257/E21.409

(58) Field of Classification Search .............. 257/5, 257/613, E31.029, 2, 3, 4, E21.409
See application file for complete search history.

(56) References Cited

U.S. PATENT DOCUMENTS 3,271,591 A    9/1966 Ovshinsky
3,530,441 A    9/1970 Ovshinsky
4,599,705 A    7/1986 Holmberg et al.
4,719,594 A    1/1988 Young et al.

(Continued)

FOREIGN PATENT DOCUMENTS

WO    WO 00/45108 A1    8/2000

(Continued)

OTHER PUBLICATIONS

Ahn, S. J. et al., "Highly Reliable 5nm Contact Cell Technology for 256Mb PRAM," VLSI Technology, Digest of Technical Papers, Jun. 14-16, 2005, pp. 98-99.

(Continued)

*Primary Examiner*—Hung Vu
*Assistant Examiner*—Vernon P Webb
(74) *Attorney, Agent, or Firm*—Haynes Beffel & Wolfeld LLP

(57) ABSTRACT

A memory device includes, a first electrode element, generally planar in form, having an inner contact surface. Then there is a cylindrical cap layer, spaced from the first electrode element, and a phase change element having contact surfaces in contact with the first electrode contact surface and the cap layer, in which the lateral dimension of the phase change element is less than that of the first electrode element and the cylindrical cap layer. A second electrode element extends through the cap layer to make contact with the phase change element. Side walls aligned with the cap layer, composed of dielectric fill material, extend between the first electrode elements and the cap layer, such that the phase change element, the contact surface of the first electrode element and the side walls define a gas-filled thermal isolation cell adjacent the phase change element.

20 Claims, 8 Drawing Sheets

U.S. PATENT DOCUMENTS

| | | |
|---|---|---|
| 4,876,220 A | 10/1989 | Mohsen et al. |
| 4,959,812 A | 9/1990 | Momodomi et al. |
| 5,166,096 A | 11/1992 | Cote et al. |
| 5,166,758 A | 11/1992 | Ovshinsky et al. |
| 5,177,567 A | 1/1993 | Klersy et al. |
| 5,515,488 A | 5/1996 | Stephens, Jr. |
| 5,534,712 A | 7/1996 | Ovshinsky et al. |
| 5,687,112 A | 11/1997 | Ovshinsky |
| 5,789,277 A | 8/1998 | Zahorik et al. |
| 5,789,758 A | 8/1998 | Reinberg |
| 5,814,527 A | 9/1998 | Wolstenholme et al. |
| 5,831,276 A | 11/1998 | Gonzalez et al. |
| 5,837,564 A | 11/1998 | Sandhu et al. |
| 5,869,843 A | 2/1999 | Harshfield |
| 5,879,955 A | 3/1999 | Gonzalez et al. |
| 5,920,788 A | 7/1999 | Reinberg |
| 5,952,671 A | 9/1999 | Reinberg et al. |
| 5,958,358 A | 9/1999 | Tenne et al. |
| 5,970,336 A | 10/1999 | Wolstenholme et al. |
| 5,985,698 A | 11/1999 | Gonzalez et al. |
| 5,998,244 A | 12/1999 | Wolstenholme et al. |
| 6,011,725 A | 1/2000 | Eitan |
| 6,025,220 A | 2/2000 | Sandhu |
| 6,031,287 A | 2/2000 | Harshfield |
| 6,034,882 A | 3/2000 | Johnson et al. |
| 6,077,674 A | 6/2000 | Schleifer et al. |
| 6,077,729 A | 6/2000 | Harshfield |
| 6,087,269 A | 7/2000 | Williams |
| 6,087,674 A | 7/2000 | Ovshinsky et al. |
| 6,104,038 A | 8/2000 | Gonzalez et al. |
| 6,111,264 A | 8/2000 | Wolstenholme et al. |
| 6,114,713 A | 9/2000 | Zahorik |
| 6,117,720 A | 9/2000 | Harshfield |
| 6,147,395 A | 11/2000 | Gilgen |
| 6,150,253 A | 11/2000 | Doan et al. |
| 6,153,890 A | 11/2000 | Wolstenholme et al. |
| 6,177,317 B1 | 1/2001 | Huang et al. |
| 6,185,122 B1 | 2/2001 | Johnson et al. |
| 6,189,582 B1 | 2/2001 | Reinberg et al. |
| 6,236,059 B1 | 5/2001 | Wolstenholme et al. |
| RE37,259 E | 7/2001 | Ovshinsky |
| 6,271,090 B1 | 8/2001 | Huang et al. |
| 6,280,684 B1 | 8/2001 | Yamada et al. |
| 6,287,887 B1 | 9/2001 | Gilgen |
| 6,314,014 B1 | 11/2001 | Lowrey et al. |
| 6,320,786 B1 | 11/2001 | Chang et al. |
| 6,339,544 B1 | 1/2002 | Chiang et al. |
| 6,351,406 B1 | 2/2002 | Johnson et al. |
| 6,420,215 B1 | 7/2002 | Knall et al. |
| 6,420,216 B1 | 7/2002 | Clevenger et al. |
| 6,420,725 B1 | 7/2002 | Harshfield |
| 6,423,621 B2 | 7/2002 | Doan et al. |
| 6,429,064 B1 | 8/2002 | Wicker |
| 6,462,353 B1 | 10/2002 | Gilgen |
| 6,483,736 B2 | 11/2002 | Johnson et al. |
| 6,487,114 B2 | 11/2002 | Jong et al. |
| 6,501,111 B1 | 12/2002 | Lowrey |
| 6,511,867 B2 | 1/2003 | Lowrey et al. |
| 6,512,241 B1 | 1/2003 | Lai |
| 6,514,788 B2 | 2/2003 | Quinn |
| 6,534,781 B2 | 3/2003 | Dennison |
| 6,545,903 B1 | 4/2003 | Wu |
| 6,555,860 B2 | 4/2003 | Lowrey et al. |
| 6,563,156 B2 | 5/2003 | Harshfield |
| 6,566,700 B2 | 5/2003 | Xu |
| 6,567,293 B1 | 5/2003 | Lowrey et al. |
| 6,579,760 B1 | 6/2003 | Lung |
| 6,586,761 B2 | 7/2003 | Lowrey |
| 6,589,714 B2 | 7/2003 | Maimon et al. |
| 6,593,176 B2 | 7/2003 | Dennison |
| 6,597,009 B2 | 7/2003 | Wicker |
| 6,605,527 B2 | 8/2003 | Dennison et al. |
| 6,605,821 B1 | 8/2003 | Lee et al. |
| 6,607,974 B2 | 8/2003 | Harshfield |
| 6,613,604 B2 | 9/2003 | Maimon et al. |
| 6,617,192 B1 | 9/2003 | Lowrey et al. |
| 6,621,095 B2 | 9/2003 | Chiang et al. |
| 6,627,530 B2 | 9/2003 | Li et al. |
| 6,639,849 B2 | 10/2003 | Takahashi et al. |
| 6,673,700 B2 | 1/2004 | Dennison et al. |
| 6,744,088 B1 | 6/2004 | Dennison |
| 6,791,102 B2 | 9/2004 | Johnson et al. |
| 6,797,979 B2 | 9/2004 | Chiang et al. |
| 6,800,504 B2 | 10/2004 | Li et al. |
| 6,800,563 B2 | 10/2004 | Xu |
| 6,805,563 B2 | 10/2004 | Xu |
| 6,815,704 B1 | 11/2004 | Chen |
| 6,830,952 B2 | 12/2004 | Lung et al. |
| 6,850,432 B2 | 2/2005 | Lu et al. |
| 6,859,389 B2 | 2/2005 | Idehara et al. |
| 6,861,267 B2 | 3/2005 | Xu et al. |
| 6,864,500 B2 | 3/2005 | Gilton |
| 6,864,503 B2 | 3/2005 | Lung |
| 6,867,638 B2 | 3/2005 | Saiki et al. |
| 6,888,750 B2 | 5/2005 | Walker et al. |
| 6,894,305 B2 | 5/2005 | Yi et al. |
| 6,903,362 B2 | 6/2005 | Wyeth et al. |
| 6,909,107 B2 | 6/2005 | Rodgers et al. |
| 6,927,410 B2 | 8/2005 | Chen |
| 6,933,516 B2 | 8/2005 | Xu |
| 6,936,840 B2 | 8/2005 | Sun et al. |
| 6,937,507 B2 | 8/2005 | Chen |
| 6,992,932 B2 | 1/2006 | Cohen |
| 7,023,009 B2 | 4/2006 | Kostylev et al. |
| 7,033,856 B2 | 4/2006 | Lung et al. |
| 7,042,001 B2 | 5/2006 | Kim et al. |
| 7,067,865 B2 | 6/2006 | Lung et al. |
| 7,126,149 B2 | 10/2006 | Iwasaki et al. |
| 7,132,675 B2 | 11/2006 | Gilton |
| 7,166,533 B2 | 1/2007 | Happ |
| 7,214,958 B2 | 5/2007 | Happ |
| 7,220,983 B2 | 5/2007 | Lung |
| 2004/0051094 A1 | 3/2004 | Ooishi |
| 2004/0248339 A1 | 12/2004 | Lung |
| 2005/0029502 A1 | 2/2005 | Hudgens |
| 2005/0093022 A1 | 5/2005 | Lung |
| 2005/0167656 A1 | 8/2005 | Sun et al. |
| 2005/0201182 A1 | 9/2005 | Osada et al. |
| 2005/0212024 A1 | 9/2005 | Happ |
| 2005/0215009 A1 | 9/2005 | Cho |
| 2006/0108667 A1 | 5/2006 | Lung |
| 2006/0110878 A1 | 5/2006 | Lung et al. |
| 2006/0118913 A1 | 6/2006 | Yi et al. |
| 2006/0175599 A1 | 8/2006 | Happ |
| 2006/0226409 A1 | 10/2006 | Burr et al. |
| 2006/0234138 A1 | 10/2006 | Fehlhaber et al. |
| 2006/0284157 A1 | 12/2006 | Chen et al. |
| 2006/0284158 A1 | 12/2006 | Lung et al. |
| 2006/0284214 A1 | 12/2006 | Chen |
| 2006/0284279 A1 | 12/2006 | Lung et al. |
| 2006/0286709 A1 | 12/2006 | Lung et al. |
| 2006/0286743 A1 | 12/2006 | Lung et al. |
| 2007/0030721 A1 | 2/2007 | Segal et al. |
| 2007/0037101 A1 | 2/2007 | Morioka |
| 2007/0108077 A1 | 5/2007 | Lung et al. |
| 2007/0108429 A1 | 5/2007 | Lung |
| 2007/0108430 A1 | 5/2007 | Lung |
| 2007/0108431 A1 | 5/2007 | Chen et al. |
| 2007/0109836 A1* | 5/2007 | Lung ........................ 365/148 |
| 2007/0109843 A1 | 5/2007 | Lung et al. |
| 2007/0111429 A1 | 5/2007 | Lung |
| 2007/0115794 A1 | 5/2007 | Lung |
| 2007/0117315 A1 | 5/2007 | Lai et al. |
| 2007/0121363 A1 | 5/2007 | Lung |

| | | |
|---|---|---|
| 2007/0121374 A1 | 5/2007 | Lung et al. |
| 2007/0126040 A1 | 6/2007 | Lung |
| 2007/0131922 A1 | 6/2007 | Lung |
| 2007/0131980 A1 | 6/2007 | Lung |
| 2007/0138458 A1 | 6/2007 | Lung |
| 2007/0147105 A1 | 6/2007 | Lung et al. |
| 2007/0154847 A1 | 7/2007 | Chen et al. |
| 2007/0155172 A1 | 7/2007 | Lai et al. |
| 2007/0158632 A1 | 7/2007 | Ho |
| 2007/0158633 A1 | 7/2007 | Lai et al. |
| 2007/0158645 A1 | 7/2007 | Lung |
| 2007/0158690 A1 | 7/2007 | Ho et al. |
| 2007/0158862 A1 | 7/2007 | Lung |
| 2007/0161186 A1 | 7/2007 | Ho |
| 2007/0173019 A1 | 7/2007 | Ho et al. |
| 2007/0173063 A1 | 7/2007 | Lung |
| 2007/0176261 A1 | 8/2007 | Lung |
| 2007/0257300 A1 | 11/2007 | Ho et al. |

FOREIGN PATENT DOCUMENTS

| | | |
|---|---|---|
| WO | WO 00/79539 A1 | 12/2000 |
| WO | WO 01/45108 A1 | 6/2001 |

OTHER PUBLICATIONS

Adler, David, "Amorphous-Semiconductor Devices," Sci. Amer., vol. 236, pp. 36-48, May 1977.
Adler, D. et al., "Threshold Switching in Chalcogenide-Glass Thin Films," J. Appl/Phys 51(6), Jun. 1980, pp. 3289-3309.
Ahn, S.J. et al., "A Highly Manufacturable High Density Phase Change Memory of 64 Mb and Beyond," IEEE IEDM 2004, pp. 907-910.
Axon Technologies Corporation paper: Technology Description, pp. 1-6.
Bedeschi, F. et al., "4-MB MOSFET-Selected Phase-Change Memory Experimental Chip," IEEE, 2004, 4 pp.
Blake thesis, "Investigation of GeTeSb5 Chalcogenide Films for Use as an Analog Memory," AFIT/GE/ENG/00M-04, Mar. 2000, 121 pages.
Chen, An et al., "Non-Volatile Resistive Switching for Advanced Memory Applications," IEEE IEDM , Dec. 5-7, 2005, 4 pp.
Cho, S. L. et al., "Highly Scalable On-axis Confined Cell Structure for High Density PRAM beyond 256Mb," 2005 Symposium on VLSI Technology Digest of Technical Papers, pp. 96-97.
Gibson, G. A. et al, "Phase-change Recording Medium that Enables Ultrahigh-density Electron-beam Data Storage," Applied Physics Letter, 2005, 3 pp., vol. 86.
Gill, Manzur et al., "A High-Performance Nonvolatile Memory Technology for Stand-Alone Memory and Embedded Applications," 2002 IEEE-ISSCC Technical Digest (TD 12.4), 7 pp.
Ha, Y. H. et al., "An Edge Contact Type Cell fro Phase Change RAM Featuring Very Low Power Consumption," 2003 Symposium on VLSI Technology Digest of Technical Papers, pp. 175-176.
Happ, T. D. et al., "Novel None-Mask Self-Heating Pillar Phase Change Memory," 2006 Symposium on VLSI Technology, 2 pp.
Haring Bolivar, P. et al., "Lateral Design for Phase Change Random Access Memory Cells with Low-Current Consumption," presented at $3^{rd}$ E*PCOS 04 Symposium in Balzers, Principality of Liechtenstein, Sep. 4-7, 2004, 4 pp.
Horii, H, et al., "A Novel Cell Technology Using N-doped GeSbTe Films for Phase Change RAM," 2003 Symposium on VLSI Technology Digest of Technical Papers, pp. 177-178.
Hudgens, S. et al., "Overview of Phase-Change Chalcogenide Nonvolatile Memory Technology," MRS Bulletin, Nov. 2004, pp. 829-832.
Hwang, Y. N. et al., "Full Integration and Reliability Evaluation of Phase-change RAM Based on 0.24μm-CMOS Technologies," 2003 Symposium on VLSI Technology Digest of Technical Papers, pp. 173-174.
Iwasaki, Hiroko et al., "Completely Erasable Phase Change Optical Disk," Jpn. J. Appl. Phys., Feb. 1992, pp. 461-465, vol. 31.
Jeong, C. W. et al., "Switching Current Scaling and Reliability Evaluation in PRAM," IEEE Non-Volatile Semiconductor Memory Workshop, Monterey, CA, 2004, pp. 28-29 and workshop cover sheet.

Kim, Kinam et al., "Reliability Investigations for Manufacturable High Density PRAM," IEEE $43^{rd}$ Annual International Reliability Physics Symposium, San Jose, 2005, pp. 157-162.
Kojima, Rie et al., "Ge-Sn-Sb-Te Phase-change Recording Material Having High Crystallization Speed," Proceedings of PCOS 2000, pp. 36-41.
Lacita, A. L.; "Electrothermal and Phase-change Dynamics in Chalcogenide-based Memories," IEEE IEDM 2004, 4 pp.
Lai, Stefan, "Current Status of the Phase Change Memory and Its Future," IEEE IEDM 2003, pp. 255-258.
Lai, Stephan et al., OUM-A 180 nm Nonvolatile Memory Cell Element Technology for Stand Alone and Embedded Applications, IEEE IEDM 2001, pp. 803-806.
Lankhorst, Martijn H. R., et al; Low-Cost and Nanoscale Non-Volatile Memory Concept for Future Silicon Chips, Mar. 13, 2005, 6 pp., Nature Materials Advance Online Publication, www.nature.com/naturematerials.
"Magnetic Bit Boost," www.sciencenews.org, Dec. 18 & 25, 2004, p. 389, vol. 166.
Mott, Nevill, "Electrons in Glass," Nobel Lecture, Dec. 8, 1977, Physics, 1977, pp. 403-413.
"New Memories Tap Spin, Gird for Battle," Science News, Apr. 3, 1999, p. 223, vol. 155.
Ovonyx Non-Confidential paper entitled "Ovonic Unified Memory," Dec. 1999, pp. 1-80.
Ovshinsky, Sandford R., "Reversible Electrical Switching Phenomena in Disordered Structures," Physical Review Letters, vol. 21, No. 20, Nov. 11, 1968, pp. 1450-1453.
Owen, Alan E. et al., "Electronic Conduction and Switching in Chalcogenide Glasses," IEEE Transactions on Electron Devices, vol. Ed. 20, No. 2, Feb. 1973, pp. 105-122.
Pellizer, F. et al., "Novel μTrench Phase-Change Memory Cell for Embedded and Stand Alone Non-Volatile Memory Applications," 2004 Symposium on VLSI Technology Digest of Technical Papers, pp. 18-19.
Pirovano, Agostino et al., "Reliability Study of Phase-Change Nonvolatile Memories," IEEE Transactions on Device and Materials Reliability, Sep. 2004, pp. 422-427, vol. 4, No. 3.
Prakash, S. et al., "A Guideline for Designing Chalcogenide-Based Glasses for Threshold Switching Characteristics," IEEE Electron Device Letters, vol. 18, No. 2, Feb. 1997, pp. 45-47.
Radaelli, A. et al., "Electronic Switching Effect and Phase-Change Transition in Chalcogenide Materials," IEEE Electron Device Letters, Oct. 2004, pp. 684-686, vol. 25, No. 10.
"Remembering on the Cheap," www.sciencenews.org, Mar. 19, 2005, p. 189, vol. 167.
Rochefort, C. et al., "Manufacturing of High Aspect-Ration p-n Junctions Using Vapor Phase Doping for Application in Multi-Resurf Devices," IEEE 2002.
Strauss, Karl F. et al., "Overview of Radiation Tolerant Unlimited Write Cycle Non-Volatile Memory," IEEE 2000.
Subramanian, Vivek et al., "Low Leakage Germanium-Seeded Laterally-Crystallized Single-Grain 100-nm TFT's for Vertical Intergration Applications," IEEE Electron Device Letters, vol. 20, No. 7, Jul. 1999.
Wicker, Guy et al., Nonvolatile, High Density, High Performance Phase Change Memory, 1999, http://klabs.org/richcontent/MAPLDCon99/Papers/P21_Tyson_P.PDF#search='nonvolatile%20high%20density%20high%20performance%20phase%20change%20memory', 8 pages.
Wicker, Guy, "A Comprehensive Model of Submicron Chalcogenide Switching Devices," Doctoral Dissertation, Wayne State University, Detroit, MI, 1996.
Wolf, Stanley, Excerpt from: Silicon Processing for the VLSI Era-vol. 4, pp. 674-679, 2004.
Wuttig, Matthias, "Towards a Universal Memory?" Nature Materials, Apr. 2005, pp. 265-266, vol. 4.
Yi, J. H. et al., "Novel Cell Structure of PRAM with Thin Metal Layer inserted GeSbTe," IEEE IEDM 2003, 4 pages.
Yonehara, T. et al., "Control of Grain Boundary Location by Selective Nucleation Over Amorphous Substrates," Mat. Res. Soc. Symp. Proc., vol. 106, 1998, pp. 21-26.

* cited by examiner

AIR CELL THERMAL ISOLATION FOR A MEMORY ARRAY FORMED OF A PROGRAMMABLE RESISTIVE MATERIAL

REFERENCE TO RELATED APPLICATION

This application claims the benefit of U.S. Provisional Patent Application No. 60/739,089, entitled "Air Cell Thermal Isolation for a Phase Change Memory Array" filed on Nov. 21, 2005. That application is incorporated by reference for all purposes.

BACKGROUND OF THE INVENTION

1. Field of the Invention

The present invention is generally related to the field of non-volatile memory devices, and more particularly to the field of memory devices that employ programmable resistive materials.

2. Description of Related Art

Materials that have the property of changing resistive state from a high value to a low value in a rapid, predictable fashion have found wide use. Because both states are stable, such materials lend themselves to memory-oriented applications. One important class of such materials are those that accomplish the resistance shift by changing phase.

Phase change based memory materials are widely used in read-write optical disks, and such materials are seeing increasing use in computer memory devices. These materials have at least two solid phases, including for example a generally amorphous solid phase and a generally crystalline solid phase. Laser pulses are used in read-write optical disks to switch between phases and to read the optical properties of the material after the phase change, and electrical pulses are employed for the same purpose in integrated circuit memory devices.

Phase change based memory materials, like chalcogenide based materials and similar materials, also can be caused to change phase by application of electrical current at levels suitable for implementation in integrated circuits. The generally amorphous state is characterized by higher resistivity than the generally crystalline state, and resistance of the material can be readily sensed to indicate data. These properties have generated interest in using programmable resistive material to form nonvolatile memory circuits, which can be read and written with random access.

The change from the amorphous to the crystalline state is generally a lower current operation. The change from crystalline to amorphous, referred to as reset herein, is generally a higher current operation, which includes a short high current density pulse to melt or breakdown the crystalline structure, after which the phase change material cools quickly, quenching the phase change process, allowing at least a portion of the phase change structure to stabilize in the amorphous state. It is desirable to minimize the magnitude of the reset current used to cause transition of phase change material from crystalline state to amorphous state. The magnitude of the reset current needed for reset can be reduced by reducing the size of the phase change material element in the cell and of the contact area between electrodes and the phase change material, so that higher current densities are achieved with small absolute current values through the phase change material element.

One direction of development has been toward forming small pores in an integrated circuit structure, and using small quantities of programmable resistive material to fill the small pores. Patents illustrating development toward small pores include: Ovshinsky, "Multibit Single Cell Memory Element Having Tapered Contact," U.S. Pat. No. 5,687,112, issued Nov. 11, 1997; Zahorik et al., "Method of Making Chalogenide [sic] Memory Device," U.S. Pat. No. 5,789,277, issued Aug. 4, 1998; Doan et al., "Controllable Ovonic Phase-Change Semiconductor Memory Device and Methods of Fabricating the Same," U.S. Pat. No. 6,150,253, issued Nov. 21, 2000, and Reinberg, "Chalcogenide Memory Cell with a Plurality of Chalcogenide Electrodes," U.S. Pat. No. 5,920,788, issued Jul. 6, 1999.

A specific issue arising from conventional the phase change memory and structures is the heat sink effect of conventional designs. Generally, the prior art teaches the use of metallic electrodes on both sides of the phase change memory element, with electrodes of approximately the same size as the phase change member. Such electrodes act as heat sinks, the high heat conductivity of the metal rapidly drawing heat away from the phase change material. Because the phase change occurs as a result of heating, the heat sink effect results in a requirement for higher current, in order to effect the desired phase change.

One approach to the heat flow problem is seen in U.S. Pat. No. 6,815,704, entitled "Self Aligned Air-Gap Thermal Insulation for Nano-scale Insulated Chalcogenide Electronics (NICE) RAM", in which an attempt is made to isolate the memory cell. That structure, and the attendant fabrication process, is overly complex, yet it does not promote minimal current flow in the memory device.

It is desirable therefore to provide a memory cell structure having small dimensions and low reset currents, as well as a structure that addresses the heat conductivity problem, and a method for manufacturing such structure that meets tight process variation specifications needed for large-scale memory devices. It is further desirable to provide a manufacturing process and a structure, which are compatible with manufacturing of peripheral circuits on the same integrated circuit.

SUMMARY OF THE INVENTION

An aspect of the invention is a memory device. The device includes a first electrode element, generally planar in form, having an inner contact surface. Then there is a cylindrical cap layer, spaced from the first electrode element, and a phase change element having contact surfaces in contact with the first electrode contact surfaces and the cap layer, in which the lateral dimension of the phase change element is less than that of the first electrode element and the cap layer. A second electrode element extends through the cap layer to make contact with the phase change element. Side walls aligned with the cylindrical lateral surface of the cap layer, composed of dielectric fill material, extend between the first electrode element and the cap layer, such that the phase change element, the contact surface of the first electrode element and the side walls define a gas filled thermal isolation cell adjacent the phase change element.

DETAILED DESCRIPTION

The following discussion describes embodiments of the invention with reference to the Figures. It will be understood that the examples and features shown are exemplary and illustrative in nature and not intended to limit the scope of the invention. That scope is defined solely by the claims appended hereto.

The present invention concerns memory elements and memory cells. As used herein, and as is well known in the art, a memory cell is a circuit device designed to have an alterable characteristic to indicate the logic level representing one bit or multiple bits of data per cell. Memory cells are arrayed to provide, for example, the random access memory for a computer.

Figure 1:
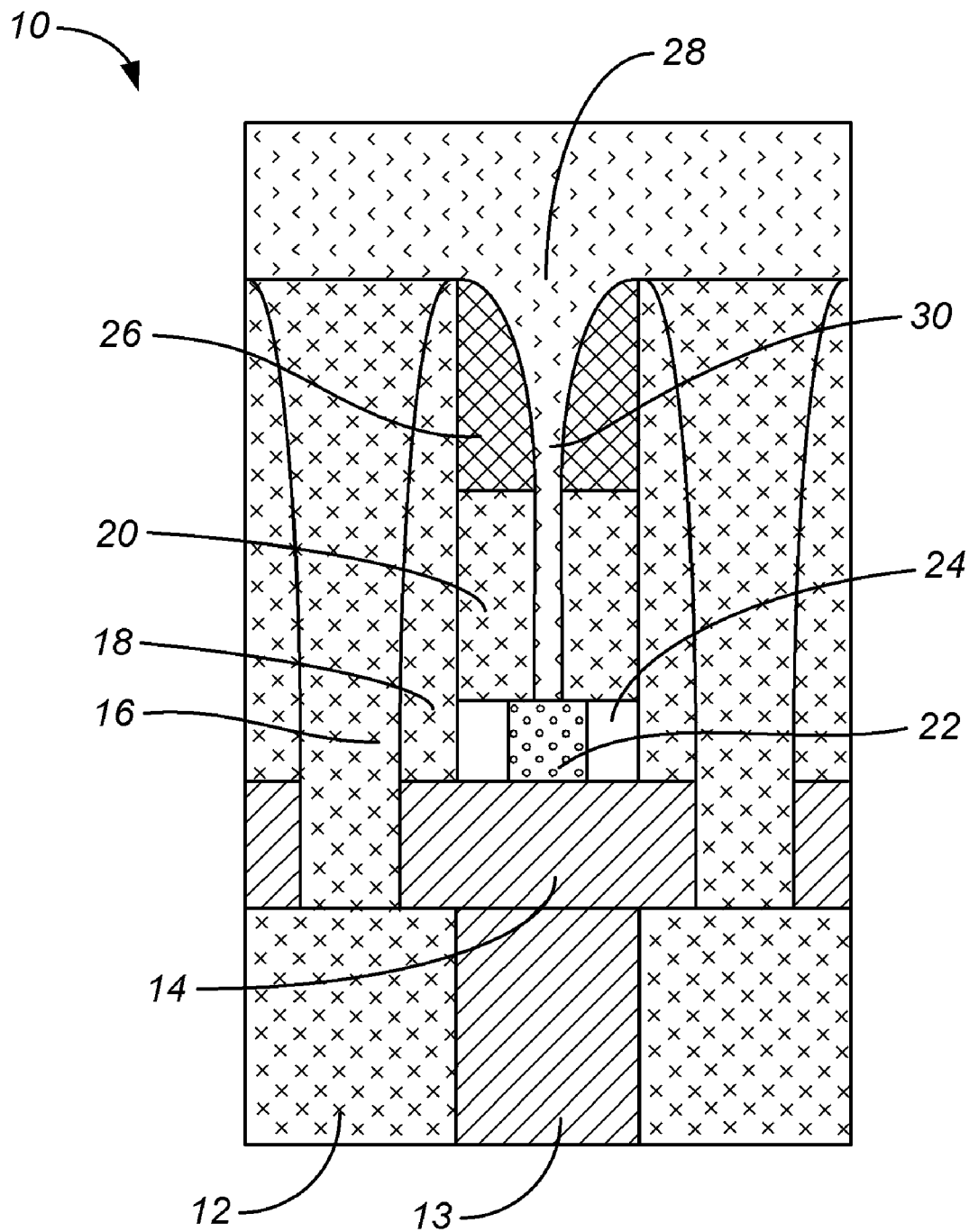
FIG. 1 is a cross-sectional view that illustrates an embodiment of a phase change memory element employing an air cell thermal isolation element.

A memory element 10, an embodiment of the present invention, is illustrated generally in FIG. 1. As seen there, the memory element 10 is shown as a single unit, for purposes of clarity. In practice, each element is a part of a memory cell, which in turn is part of a larger memory array, as will be seen more fully below. The structure of a memory element will be discussed first, followed by a description of the process for fabricating the same.

The memory element 10 is formed on a substrate 12, which is preferably a dielectric fill material such as silicon dioxide formed over a semiconductor substrate which may have logic circuitry integrated therein to support access to the device. A lower electrode 14, preferably formed from a metal such as tungsten, is formed on a contact 13 in the substrate 12. Other suitable metals include Ti, Mo, Al, Ta, Cu, Pt, Ir, La, Ni, and Ru. The memory element 10 is separated from other such elements by a dielectric material which appears as partitions 16 in cross-section, which extend from the substrate 12 upward to the height of the memory element 10. The dielectric material of the partitions 16 can comprise a variety of suitable low-k dielectric materials, such as silicon dioxide, silicon oxynitride, silicon nitride or $Al_2O_3$, as known in the art.

A pillar-shaped stack of materials on the lower electrode 14 includes a phase change element 22, an insulating cap layer 20, and an insulating spacer 26 with an electrode element 30 extending through the insulating spacer 26 and insulating cap layer 22 at the top of the phase change element 22. The cap layer 20 has a cylindrical lateral surface with a maximum lateral dimension. In preferred embodiments, the cap layer 20 has a circularly cylindrical, or approximately circularly cylindrical, lateral surface. However, other cylindrical shapes with noncircular lateral curves can be implemented, including rectangular cylindrical surfaces. Likewise, the insulating spacer 26 has a cylindrical lateral surface substantially aligned with the cylindrical lateral surface of the cap layer. The phase change element 22 also has a cylindrical lateral surface with a maximum lateral dimension. A maximum lateral dimension of the cylindrical lateral surface of the phase change element 22 is less than the maximum lateral dimension of the cylindrical lateral surface of the cap layer 20.

Side walls 18 aligned with the cylindrical lateral surface of the cap layer 20 formed from dielectric fill material, extend from the upper surface of the lower electrode 14 to the top of the insulating spacer 26 in the illustrated embodiment, surrounding the pillar-shaped stack in the central portion of the memory element 10. The side walls 18 enclose gas filled thermal isolation regions 24 between a lateral surface of the phase change element 22 and the side walls 18. The gas-filled thermal isolation regions 24 are further delimited by the top surface of the lower electrode 14 and the bottom surface of the cap layer 20.

Embodiments of the memory element 10 include resistive RAM based memory materials, including chalcogenide based materials and other materials, for the phase change memory element 22. Chalcogens include any of the four elements oxygen (O), sulfur (S), selenium (Se), and tellurium (Te), forming part of group VI of the periodic table. Chalcogenides comprise compounds of a chalcogen with a more electropositive element or radical. Chalcogenide alloys comprise combinations of chalcogenides with other materials such as transition metals. A chalcogenide alloy usually contains one or more elements from column six of the periodic table of elements, such as germanium (Ge) and tin (Sn). Often, chalcogenide alloys include combinations including one or more of antimony (Sb), gallium (Ga), indium (In), and silver (Ag). Many resistive RAM based memory materials have been described in technical literature, including alloys of: Ga/Sb, In/Sb, In/Se, Sb/Te, Ge/Te, Ge/Sb/Te, In/Sb/Te, Ga/Se/Te, Sn/Sb/Te, In/Sb/Ge, Ag/In/Sb/Te, Ge/Sn/Sb/Te, Ge/Sb/Se/Te and Te/Ge/Sb/S. In the family of Ge/Sb/Te alloys, a wide range of alloy compositions may be workable. The compositions can be characterized as $Te_a Ge_b Sb_{100-(a+b)}$. One researcher has described the most useful alloys as having an average concentration of Te in the deposited materials well below 70%, typically below about 60% and ranged in general from as low as about 23% up to about 58% Te and most preferably about 48% to 58% Te. Concentrations of Ge were above about 5% and ranged from a low of about 8% to about 30% average in the material, remaining generally below 50%. Most preferably, concentrations of Ge ranged from about 8% to about 40%. The remainder of the principal constituent elements in this composition was Sb. These percentages are atomic percentages that total 100% of the atoms of the constituent elements. (Ovshinsky '112 patent, cols 10-11.) Particular alloys evaluated by another researcher include $Ge_2Sb_2Te_5$, $GeSb_2Te_4$ and $GeSb_4Te_7$ (Noboru Yamada, "Potential of Ge—Sb—Te Phase-Change Optical Disks for High-Data-Rate Recording", *SPIE* v. 3109, pp. 28-37 (1997).) More generally, a transition metal such as chromium (Cr), iron (Fe), nickel (Ni), niobium (Nb), palladium (Pd), platinum (Pt) and mixtures or alloys thereof may be combined with Ge/Sb/Te to form a phase change alloy that has programmable resistive properties. Specific examples of memory materials that may be useful are given in Ovshinsky '112 at columns 11-13, which examples are hereby incorporated by reference.

Phase change alloys are capable of being switched between a first structural state in which the material is in a generally amorphous solid phase, and a second structural state in which the material is in a generally crystalline solid phase in its local order in the active channel region of the cell. These alloys are at least bistable. The term amorphous is used to refer to a relatively less ordered structure, more disordered than a single crystal, which has the detectable characteristics such as higher electrical resistivity than the crystalline phase. The term crystalline is used to refer to a relatively more ordered structure, more ordered than in an amorphous structure, which has detectable characteristics such as lower electrical resistivity than the amorphous phase. Typically, phase change materials may be electrically switched between different detectable states of local order across the spectrum between completely amorphous and completely crystalline states.

Other material characteristics affected by the change between amorphous and crystalline phases include atomic order, free electron density and activation energy. The material may be switched either into different solid phases or into mixtures of two or more solid phases, providing a gray scale between completely amorphous and completely crystalline states. The electrical properties in the material may vary accordingly.

Phase change alloys can be changed from one phase state to another by application of electrical pulses. It has been observed that a shorter, higher amplitude pulse tends to change the phase change material to a generally amorphous state. A longer, lower amplitude pulse tends to change the phase change material to a generally crystalline state. The energy in a shorter, higher amplitude pulse is high enough to allow for bonds of the crystalline structure to be broken and short enough to prevent the atoms from realigning into a crystalline state. Appropriate profiles for pulses can be determined, without undue experimentation, specifically adapted to a particular phase change alloy. In following sections of the disclosure, the phase change material is referred to as GST, and it will be understood that other types of phase change materials can be used. A material useful for implementation of a PCRAM described herein is $Ge_2Sb_2Te_5$.

Other programmable resistive memory materials may be used in other embodiments of the invention, including $N_2$ doped GST, $Ge_xSb_y$, or other material that uses different crystal phase changes to determine resistance; $Pr_xCa_yMnO_3$, PrSrMnO, ZrOx, or other material that uses an electrical pulse to change the resistance state; 7,7,8,8-tetracyanoquinodimethane (TCNQ), methanofullerene 6,6-phenyl C61-butyric acid methyl ester (PCBM), TCNQ-PCBM, Cu-TCNQ, Ag-TCNQ, C60-TCNQ, TCNQ doped with other metal, or any other polymer material that has bistable or multi-stable resistance state controlled by an electrical pulse.

The following are short summaries describing four types of resistive memory materials. The first type is chalcogenide material, such as $Ge_xSb_yTe$, where $x:y:z=2:2:5$, or other compositions with x: 0~5; y: 0~5; z: 0~10. GeSbTe with doping, such as N—, Si—, Ti—, or other element doping is alternatively used.

An exemplary method for forming chalcogenide material uses PVD-sputtering or magnetron-sputtering method with source gas(es) of Ar, $N_2$, and/or He, etc. at the pressure of 1 mTorr~100 mTorr. The deposition is usually done at room temperature. A collimator with an aspect ratio of 1~5 can be used to improve the fill-in performance. To improve the fill-in performance, a DC bias of several tens of volts to several hundreds of volts is also used. On the other hand, the combination of DC bias and the collimator can be used simultaneously.

A post-deposition annealing treatment in vacuum or in an $N_2$ ambient is optionally performed to improve the crystallize state of chalcogenide material. The annealing temperature typically ranges from 100° C. to 400° C. with an anneal time of less than 30 minutes.

The thickness of chalcogenide material depends on the design of cell structure. In general, a chalcogenide material with thickness of higher than 8 nm can have a phase change characterization so that the material exhibits at least two stable resistance states.

A second type of memory material suitable for use in embodiments is colossal magnetoresistance ("CMR") material, such as $Pr_xCa_yMnO_3$ where $x:y=0.5:0.5$, or other compositions with x: 0~1; y: 0~1. CMR material that includes Mn oxide is alternatively used.

An exemplary method for forming CMR material uses PVD sputtering or magnetron-sputtering method with source gases of Ar, $N_2$, $O_2$, and/or He, etc. at the pressure of 1 mTorr~100 mTorr. The deposition temperature can range from room temperature to ~600° C., depending on the post deposition treatment condition. A collimator with an aspect ratio of 1~5 can be used to improve the fill-in performance. To improve the fill-in performance, the DC bias of several tens of volts to several hundreds of volts is also used. On the other hand, the combination of DC bias and the collimator can be used simultaneously. A magnetic field of several tens of Gauss to as much as a Tesla (10,000 Gauss) may be applied to improve the magnetic crystallized phase.

A post-deposition annealing treatment in vacuum or in an $N_2$ ambient or $O_2/N_2$ mixed ambient is optionally used to improve the crystallized state of CMR material. The annealing temperature typically ranges from 400° C. to 600° C. with an anneal time of less than 2 hours.

The thickness of CMR material depends on the design of the cell structure. The CMR thickness of 10 nm to 200 nm can be used for the core material. A buffer layer of YBCO (YBaCuO$_3$, which is a type of high temperature superconductor material) is often used to improve the crystallized state of CMR material. The YBCO is deposited before the deposition of CMR material. The thickness of YBCO ranges from 30 nm to 200 nm.

A third type of memory material is two-element compounds, such as $Ni_xO_y$; $Ti_xO_y$; $Al_xO_y$; $W_xO_y$; $Zn_xO_y$; $Zr_xO_y$; $Cu_xO_y$; etc, where $x:y=0.5:0.5$, or other compositions with x: 0~1; y: 0~1. An exemplary formation method uses a PVD sputtering or magnetron-sputtering method with reactive gases of Ar, $N_2$, $O_2$, and/or He, etc. at the pressure of 1 mTorr~100 mTorr, using a target of metal oxide, such as $Ni_xO_y$; $Ti_xO_y$; $Al_xO_y$; $W_xO_y$; $Zn_xO_y$; $Zr_xO_y$; $Cu_xO_y$; etc. The deposition is usually done at room temperature. A collimator with an aspect ratio of 1~5 can be used to improve the fill-in performance. To improve the fill-in performance, the DC bias of several tens of volts to several hundreds of volts is also used. If desired, the combination of DC bias and the collimator can be used simultaneously.

A post-deposition annealing treatment in vacuum or in an $N_2$ ambient or $O_2/N_2$ mixed ambient is optionally performed to improve the oxygen distribution of metal oxide. The annealing temperature ranges from 400° C. to 600° C. with an anneal time of less than 2 hours.

An alternative formation method uses a PVD sputtering or magnetron-sputtering method with reactive gases of $Ar/O_2$, $Ar/N_2/O_2$, pure $O_2$, $He/O_2$, $He/N_2/O_2$ etc. at the pressure of 1 mTorr~100 mTorr, using a target of metal oxide, such as Ni, Ti, Al, W, Zn, Zr, or Cu etc. The deposition is usually done at room temperature. A collimator with an aspect ratio of 1~5 can be used to improve the fill-in performance. To improve the fill-in performance, a DC bias of several tens of volts to several hundreds of volts is also used. If desired, the combination of DC bias and the collimator can be used simultaneously.

A post-deposition annealing treatment in vacuum or in an $N_2$ ambient or $O_2/N_2$ mixed ambient is optionally performed to improve the oxygen distribution of metal oxide. The annealing temperature ranges from 400° C. to 600° C. with an anneal time of less than 2 hours.

Yet another formation method uses oxidation by a high temperature oxidation system, such as a furnace or a rapid thermal pulse ("RTP") system. The temperature ranges from 200° C. to 700° C. with pure $O_2$ or $N_2/O_2$ mixed gas at a pressure of several mTorr to 1 atm. The time can range several minute to hours. Another oxidation method is plasma oxidation. An RF or a DC source plasma with pure $O_2$ or $Ar/O_2$ mixed gas or $Ar/N_2/O_2$ mixed gas at a pressure of 1 mTorr to 100 mTorr is used to oxidize the surface of metal, such as Ni, Ti, Al, W, Zn, Zr, or Cu etc. The oxidation time ranges several seconds to several minutes. The oxidation temperature ranges from room temperature to 300° C., depending on the degree of plasma oxidation.

A fourth type of memory material is a polymer material, such as TCNQ with doping of Cu, $C_{60}$, Ag etc. or PCBM-TCNQ mixed polymer. One formation method uses evaporation by thermal evaporation, e-beam evaporation, or molecular beam epitaxy ("MBE") system. A solid-state TCNQ and dopant pellets are co-evaporated in a single chamber. The solid-state TCNQ and dopant pellets are put in a W-boat or a Ta-boat or a ceramic boat. A high electrical current or an electron-beam is applied to melt the source so that the materials are mixed and deposited on wafers. There are no reactive chemistries or gases. The deposition is done at a pressure of $10^{-4}$ Torr to $10^{-10}$ Torr. The wafer temperature ranges from room temperature to 200° C.

A post-deposition annealing treatment in vacuum or in an $N_2$ ambient is optionally performed to improve the composition distribution of polymer material. The annealing temperature ranges from room temperature to 300° C. with an anneal time of less than 1 hour.

Another technique for forming a layer of polymer-based memory material is to use a spin-coater with doped-TCNQ solution at a rotation of less than 1000 rpm. After spin-coating, the wafer held (typically at room temperature or temperature less than 200° C.) for a time sufficient for solid-state formation. The hold time ranges from several minutes to days, depending on the temperature and on the formation conditions.

It is preferred to employ phase change materials for the memory element of the present invention, but it should be understood that any of the programmable resistance materials discussed above could be incorporated as the active memory material.

Cap layer 20 fills the central portion of the memory element 10, from the top surface of the phase change element 22 extending upward. The cap layer 20 is formed of a dielectric fill material, such as silicon dioxide or another known low-k material. Alternatively, the cap layer 20 may comprise one or more elements selected from the group consisting of Si, Ti, Al, Ta, N, O, and C. Above the cap layer 20 is insulating spacer 26, extending to the top of the partitions 16 and preferably formed of SiN or a similar material. Alternative materials include fluorine doped silicate glass (FSG), borophosphate silicate glass (BPSG), or phosphosilicate glass (PSG) can also be employed as dielectric fill material. Those in the art will understand that the primary selection criterion in this situation is the relative selectivity of the chosen materials in the etching processes, discussed below.

A central passage extends completely through the cap element 20 and the spacer element 26, and an upper electrode 28, formed atop and extending across the memory element 10, includes a contact element 30, which extends downward and occupies the entire central passage to make electrical contact with the phase change element 22. Contact element 30 has a significantly smaller cross-sectional area than does the upper surface of the phase change element 22. The preferred material for the upper electrode is TiN or TaN. Alternatively, the electrode may be TiAlN or TaAlN, or may comprise, for further examples, combinations or allows including one or more elements selected from the group consisting of Ti, W, Mo, Al, Ta, Cu, Pt, Ir, La, Ni, and Ru.

The phase change element 22 does not occupy all of the space between lower electrode 14 and cap layer 20. Rather, the phase change element 22 lies at the center of that space, surrounded by a thermal isolation cell 24, preferably containing air. Air provides considerably lower thermal conductivity than do any of the available dielectric materials known in the art, and thus the air cell provides improved thermal isolation for the phase change element 22.

In operation, current flows through the memory element 10 from lower electrode 14, into the phase change element 22, and out through the contact 30 and upper electrode 28. Of course, the current direction could be altered by changes in element geometry, as will be understood by those in the art. In either event, the phase change material is subject to joule heating as current flows, as discussed above, resulting in a temperature rise in the center of the GST material. As the temperature exceeds that required for phase change, a portion of the phase change material changes state. The temperature of the phase change material determines the effect produced, so the current is chosen to produce a temperature sufficient to create the desired result—either an amorphous state or a crystalline state—in the GST material. If it is desired to read the element status, a low current is employed for sensing purposes. The read operation is non-destructive, as the element temperature is kept below the threshold for a phase change.

Figure 1A:
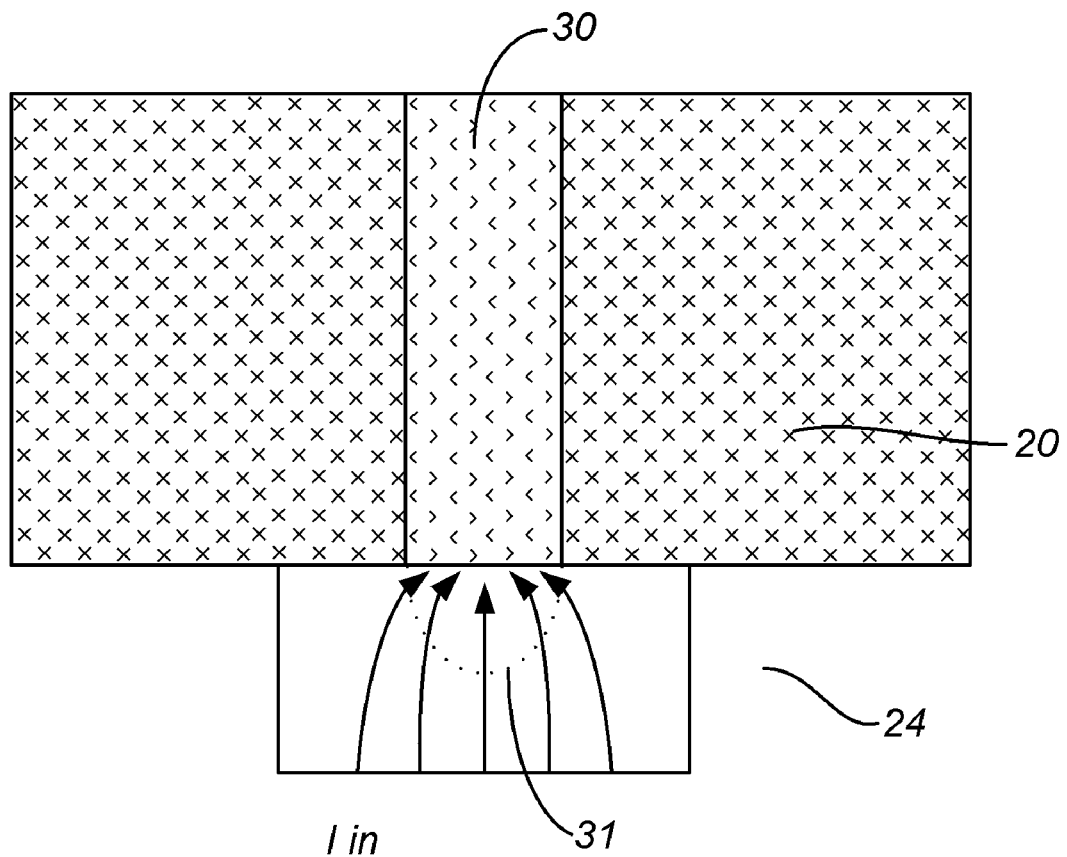
FIG. 1a illustrates a current path in a phase change memory element as shown in FIG. 1.

The thermal isolation cell 24 functions to contain heat within the phase change element 22, which has several positive effects. First, by preventing the migration of heat away from the phase change element 22, this design reduces the total heat required to effect phase changes, which in turn reduces the current required for each SET or RESET operation. At the same time, retaining heat within the phase change element reduces the heat transferred to the remainder of the memory array, which translates directly into increased lifespan for the device. Given the vast numbers of memory elements within a complete integrated circuit—at least eight billion elements for a 1 GB memory device, for example—it can be appreciated that the effects of such a heat reduction will be significant. The efficiency of the phase change element is further enhanced by the small contact area of the contact element 30. A small contact area concentrates the current, and a higher current density leads to higher temperatures in the vicinity of the contact, which in turn promotes rapid phase change in the area of the contact. This effect is shown in the detail view of FIG. 1a, in which arrows I in enter from lower electrode 14 (not shown) with a relatively uniform current density, but are concentrated at the contact with contact element 30, producing an area 31 of high temperature, which with proper current selection leads to a phase change in that area. That design leads to reduced current consumption by the memory element.

As noted above, the memory element 10 is a component of a memory cell, which in turn is part of a memory array. A memory cell is formed by adding to the memory element access circuitry, together with appropriate connection lines. The access circuitry could be a single transistor, or multiple transistors, configured as known in the art. The transistor circuitry is not shown, but it could be located, for example, in the integrated circuit below the memory element 10. Connection lines typically include word and bit lines, arranged in a matrix. Here, the upper electrode 28 could be employed as a bit line and lower electrode 14 could be used as a word line.

It is preferred that the total width of a cell (measured from the centerline of one partition to the centerline of the adjacent partition) be between about 100 and 500 nm, preferably 300 nm. The phase change element 22 should be between about 10 and 50 nm, preferably 20 nm, with is thickness between about 20 and 80 nm, preferably 40 nm. The air cell 24 should be between about 5 and 50 nm, preferably 25 nm, as measured from the end of the phase change element 22 to the side wall 18.

Figure 2:
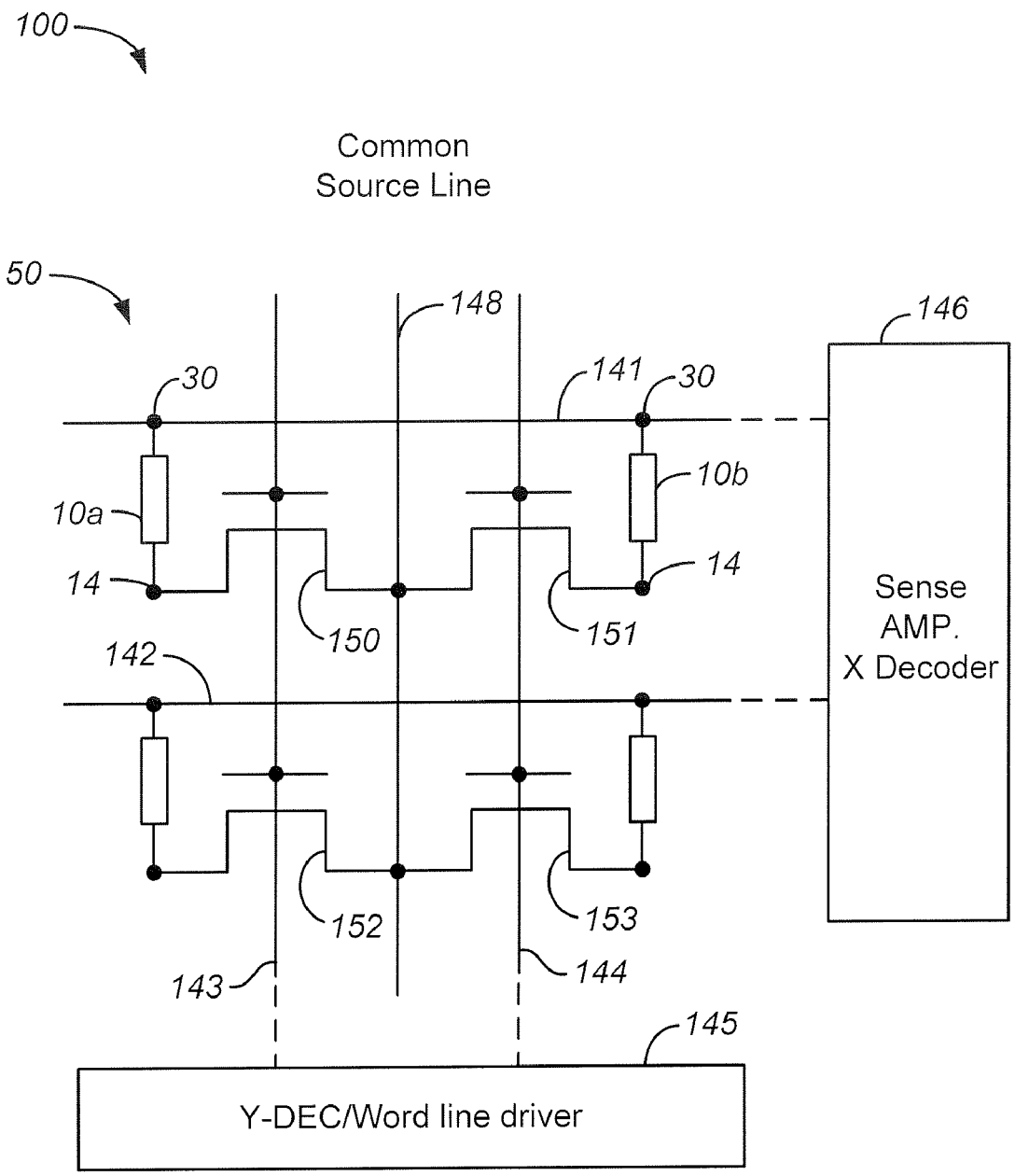
FIG. 2 schematically illustrates a circuit employing the phase change memory element of FIG. 1.

The schematic drawing of FIG. 2 shows the memory elements 10a and 10b employed in a memory cell 50, which in turn is a component of memory array 100. It will be understood that the array structure illustrated in FIG. 2 can be implemented using other cell structures. In the schematic illustration of FIG. 2, the common source line 148, the word line 143 and the word line 144 are arranged generally parallel in the Y-direction. Bit lines 141 and 142 are arranged generally parallel in the X-direction. Thus, a Y-decoder and a word line driver in block 145 are coupled to the word lines 143, 144. An X-decoder and set of sense amplifiers in block 146 are coupled to the bit lines 141 and 142. The common source line 148 is coupled to the source terminals of access transistors 150, 151, 152 and 153. The gate of access transistor 150 is coupled to the word line 143. The gate of access transistor 151 is coupled to the word line 144. The gate of access transistor 152 is coupled to the word line 143. The gate of access transistor 153 is coupled to the word line 144. The drain of access transistor 150 is coupled to the electrode member 14 for phase change memory element 10a, which is in turn coupled to electrode member 28 (not shown in this drawing). Likewise, the drain of access transistor 151 is coupled to the electrode member 14 for phase change memory element 10b, which is in turn coupled to the electrode member 30. The electrode member 30 is coupled to the bit line 141. Access transistors 152 and 153 are coupled to corresponding memory cells as well on line 142. It can be seen that the common source line 128 is shared by two rows of memory cells, where a row is arranged in the Y-direction in the illustrated schematic.

Figure 3:
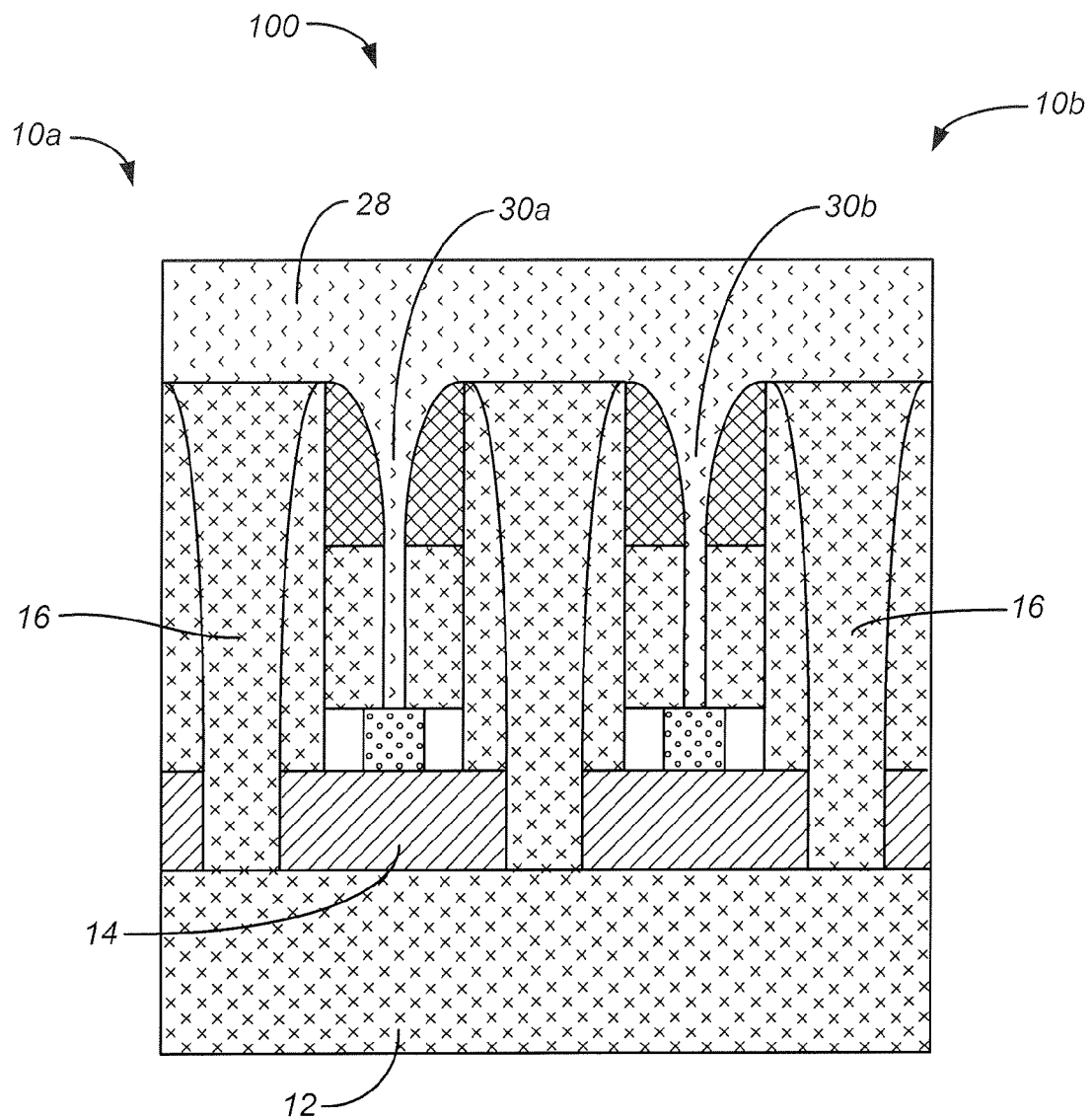
FIG. 3 illustrates a memory array employing the phase change memory element as shown in FIG. 1.

FIG. 3 shows a portion of a memory array 100, including memory elements 10a and 10b. As can be seen, the memory elements 10a, 10b are formed side-by-side in the integrated circuit, separated by partitions 16. In an embodiment of the invention, memory elements are arranged in a square matrix, with upper electrodes 28 spanning multiple elements in a direction parallel to the surface of the drawing and lower electrodes 14 spanning multiple elements in a direction perpendicular to the surface of the drawing, respectively functioning as bit lines and word lines. Upper electrode 28 has a contact element 30a/30b for each memory element 10a/10b. Each memory element includes all individual components discussed above, which will not be repeated here.

Figure 4A:
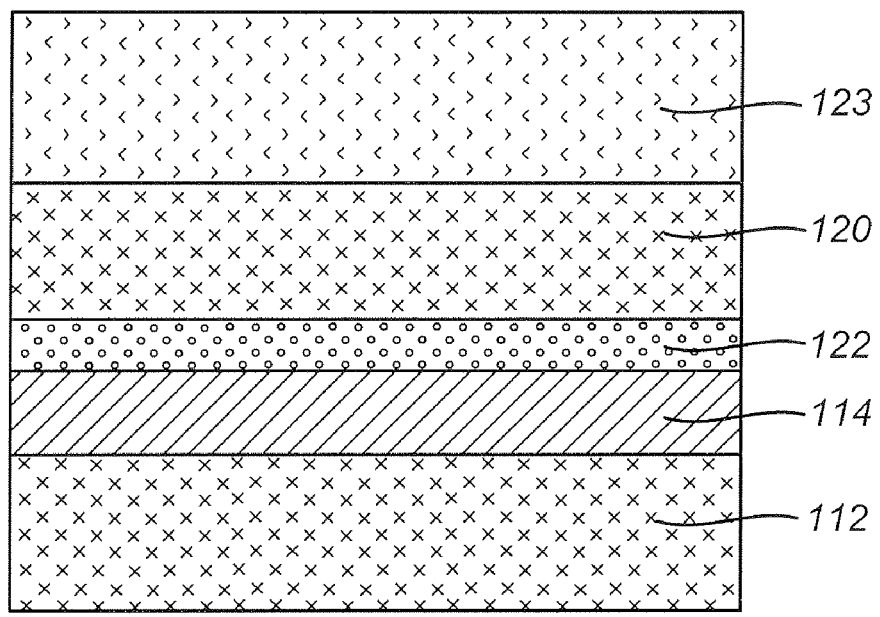
FIGS. 4a-4h illustrate an embodiment of a process for fabricating a phase change memory element as shown in FIG. 1.

FIG. 4a depicts the first step in an embodiment of the process of fabricating memory elements according to the present invention. There, an initial structure 110 is shown, composed of deposited layers including the substrate dielectric layer 112, the lower electrode layer 114, the GST layer 122, the interelectrode dielectric layer 120 to be used as the cap layer, and a top layer to be used as a sacrificial spacer layer as described below, composed of SiN.

Figure 4B:
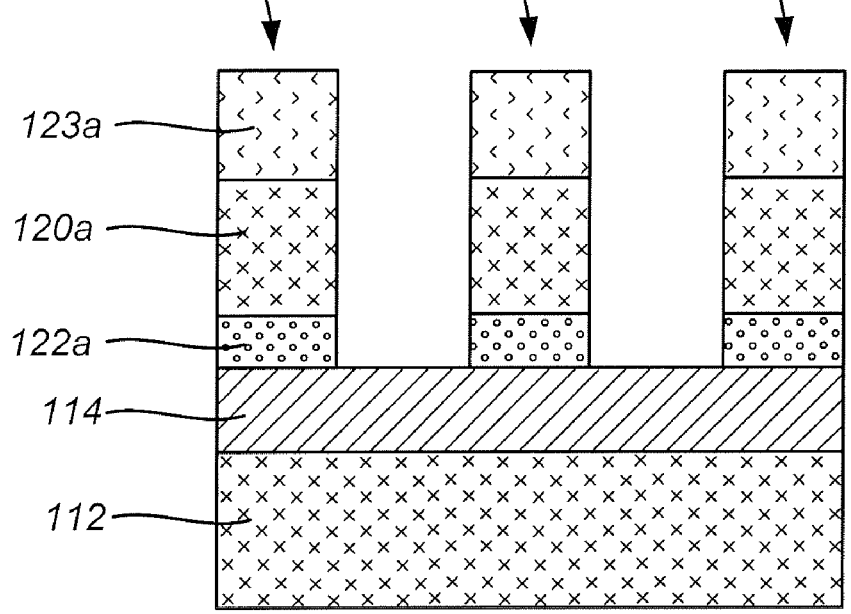

FIG. 4b depicts the results of a pillar patterning step, in which the layered structure 110 is converted to a series of pillars 111a-111c, each comprising a multilayer stack including phase change layer 122, an interelectrode dielectric layer, or cap element, 120 and a top layer 123. The drawing depicts individual pillar components labeled with the appropriate subscript, such as 122a, for example. The patterning step is conducted in accordance with conventional practice, preferably following a lithographic process of applying a photoresistive film; imprinting a pattern, as through a mask or reticle; exposing the pattern to visible light or other radiation; stripping the undesired portions of resist material to form an etch mask; and etching the material layers. It is preferred to employ a dry, anisotropic etch, which may be controlled with an optical device that senses arrival at the lower electrode layer or otherwise.

It should be noted that in this and the succeeding drawing depicting the process of the present invention, only the components of the left-hand pillar are labeled, as well as common elements and other elements particularly involved in the step being discussed. Also, the drawings will show only one memory element being formed, but those in the art will understand that the process is simultaneously forming all memory elements in an entire integrated circuit die.

Figure 4C:
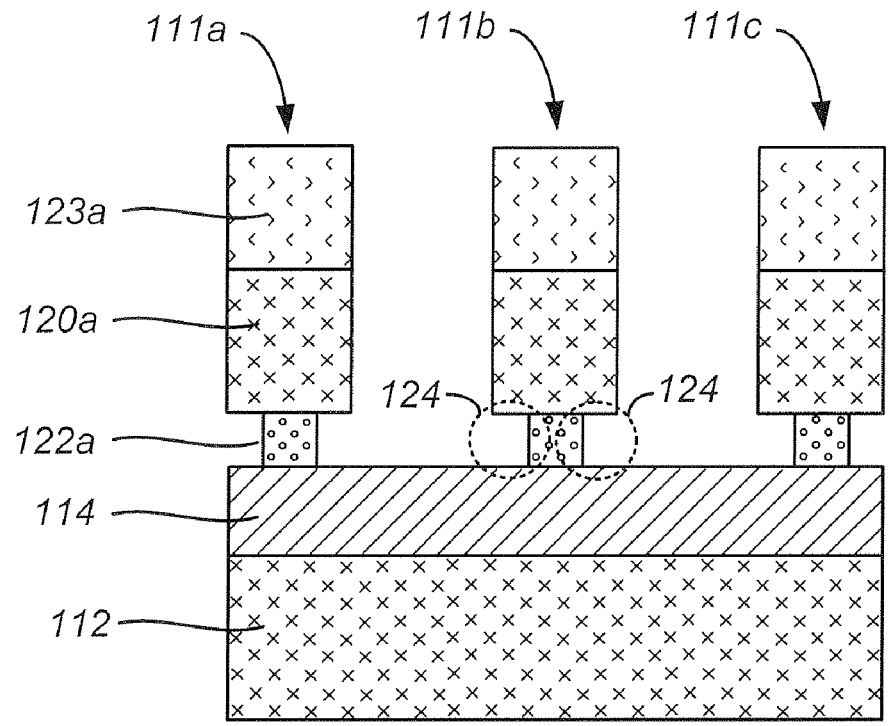

The thermal isolation cells are initially formed in the next step, the results of which are shown in FIG. 4c. The structure shown in FIG. 4b is subjected to an etch process which acts selectively on the GST material, undercutting it with respect to the overlying interelectrode dielectric layer 120 to form thermal isolation cell areas 124 (shown circled for greater clarity). By careful selection of the etch chemistry and control of the process, the amount of the undercut, and thus the shape of the cylindrical lateral surface of the remaining GST material, can be obtained consistently.

Here, a dry etch chemistry could include $Cl_2$, $BCl_3$ or HBr, either in combination or singly, together with some combination of Ar, $O_2$ or $CF_4$. The method could employ Reactive Ion Etch (RIE) technology, controlled by an end-point detection system, as known in the art. That control technique senses etching beyond the desired control point, permitting an over-etch amount of 10-50%, as can be set when designing the process details.

Figure 4D:
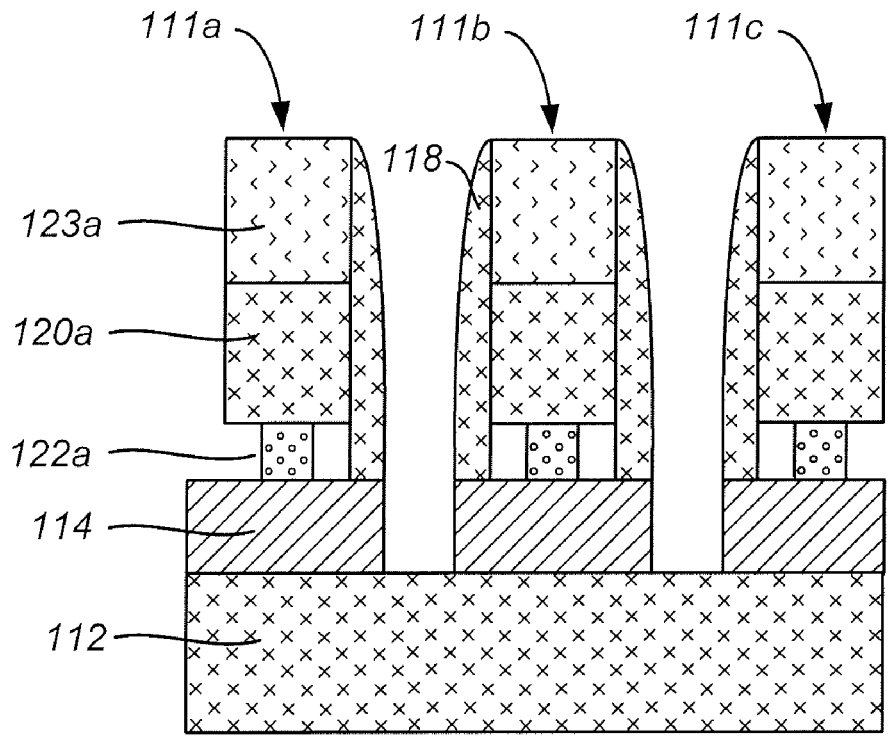

Next, side walls are formed, as seen in FIG. 4d, by first depositing a layer of dielectric fill material over the structure of FIG. 4c, to produce a deposited film aligned with the cap layer 120a on the walls of the pillars 111. The dielectric fill material on the cylindrical lateral surface of the cap layer 120a encloses the thermal isolation cells as described above, and traps gas present in the reaction chamber at the time of the deposition within gas-filled thermal isolation cells. Chemical vapor deposition (CVD) or plasma enhanced chemical vapor deposition (PECVD) are preferred for this step. A following etch step removes material at the bottom of the spaces between pillars, separating the deposited films and defining sidewalls 118. A following etch step, preferably a dry, anisotropic etch selective for the electrode layer 114, serves to separate the electrode layer into separate electrode elements, such as electrode 114a, also having a cylindrical lateral shape aligned with the outside extent of the sidewalls 118. In this case, and the substrate would include contact the underlying access circuitry as illustrated in FIG. 2.

The preferred etch methods for these steps involve first etching the oxide spacer, preferably employing $CF_4$, $C_4F_8$, $CHF_3$, or $C_4F_6$, or some combination of the same, together with Ar, $O_2$ or $N_2$, preferably employing RIE with end-point control. The stage is selective to the lower TiN layer. _The second etch step, for the TiN layer, is performed preferably with $Cl_2$, $BCl_3$ or some combination of them, with Ar, $O_2$ or $N_2$, again employing RIE with end-point control.

Figure 4E:
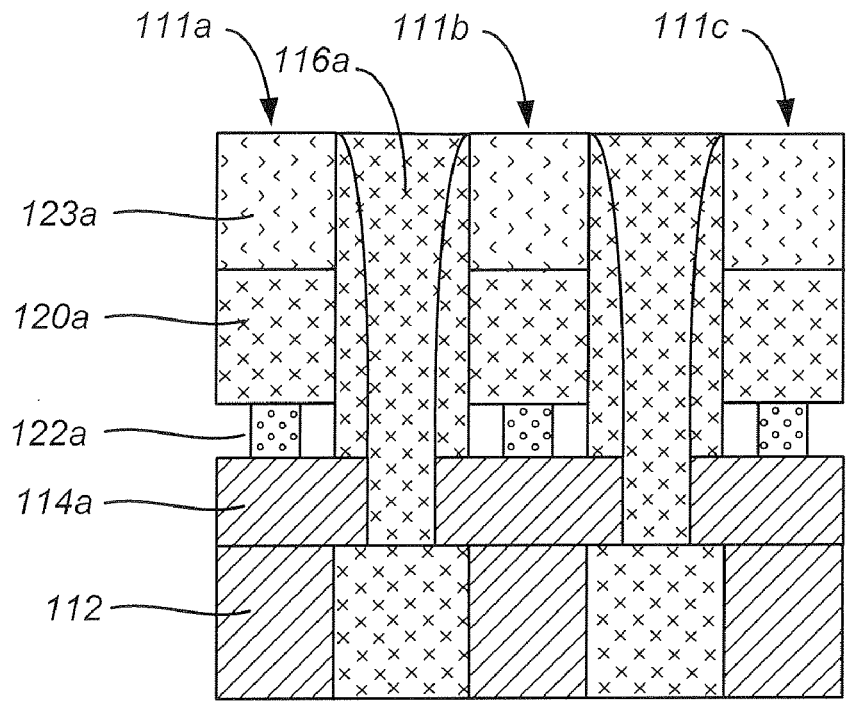

A dielectric fill establishing partitions between individual memory elements is added in the following step, seen in FIG. 4e. A suitable dielectric material, as discussed above, is deposited into the area between the pillars, completely filling that space. It is preferred to overfill that space and to employ a planarizing step, as with chemical-mechanical polishing (CMP) to reduce the size of the partitions to a desired amount.

Figure 4F:
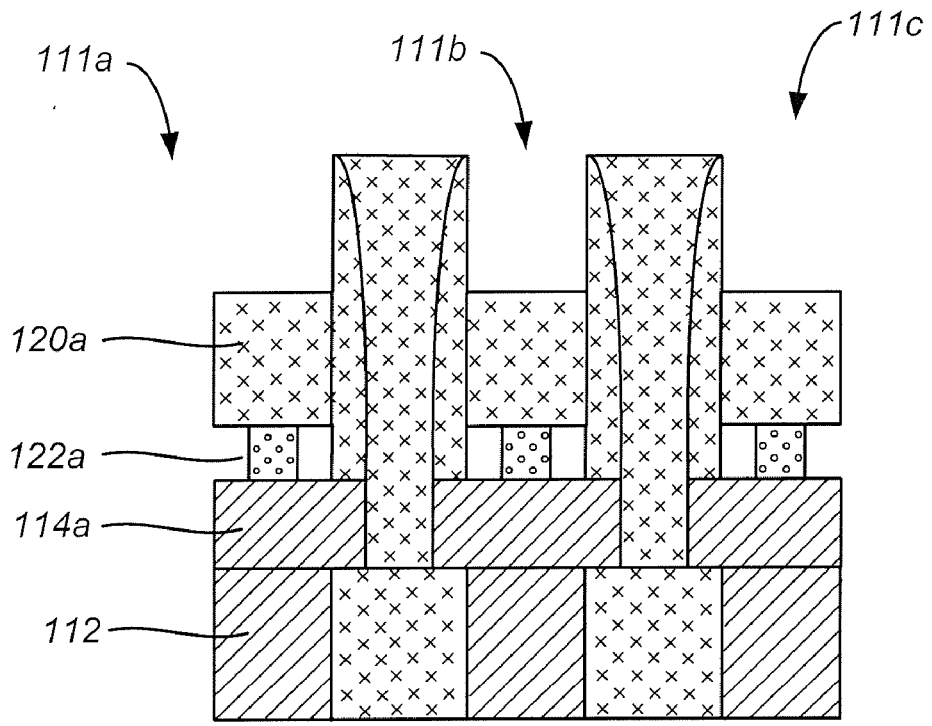
Figure 4G:
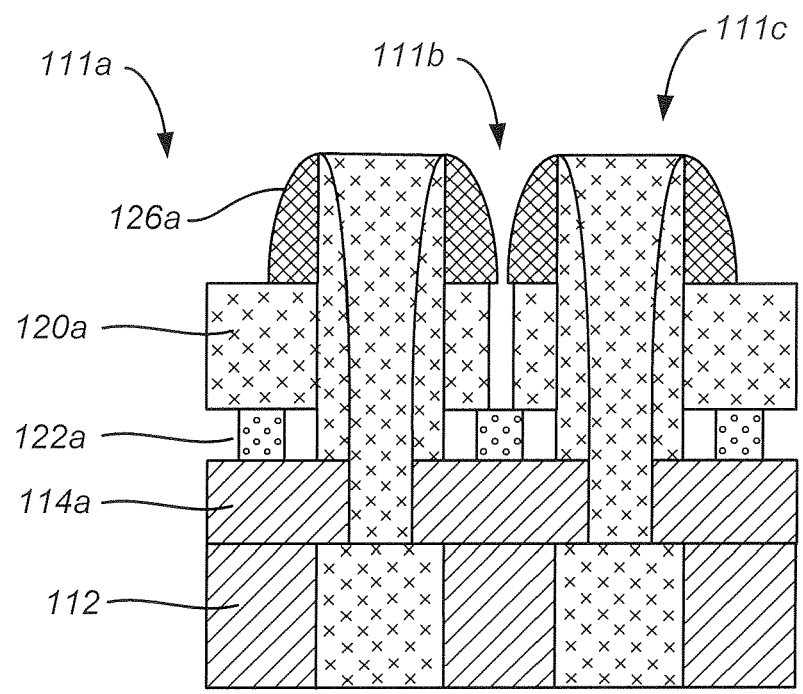

FIG. 4f depicts the results of the next step, removing the remaining portions of the top sacrificial spacer layer. When this layer is formed from SiN, as preferred, the preferred etchant is $H_3PO_4$, in a wet dip, thus producing higher selectivity regarding the $SiO_2$ layers 120a and 116a.

The following step calls for the formation of a spacer element 126 atop the cap element within the void formed by removing a sacrificial spacer layer 123a. The spacer element is preferably formed of SiN, as discussed above, and it is deposited and a cup-shaped cavity is etched away, extending completely through the element. A second etch is performed on the underlying cap element, preferably an anisotropic etch that opens a narrow, straight passage completely through the element. An end point stop can be utilized to control the etch, stopping on arrival at the GST material.

Figure 4H:
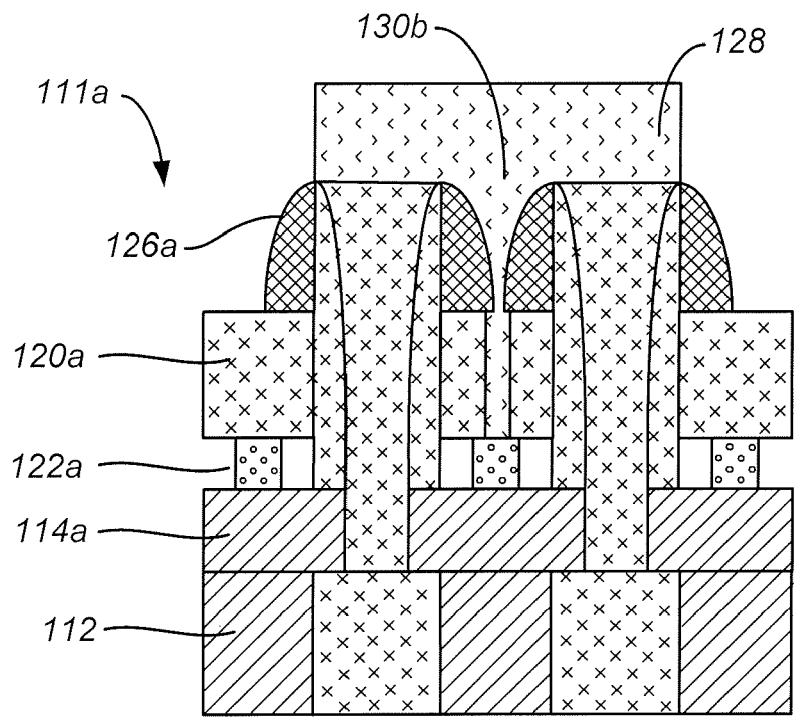

The final step, seen in FIG. 4h, results in the formation of the upper electrode 128, including the contact elements 130. The deposition must be controlled using atomic layer deposition or chemical vapor deposition technologies to ensure that the contact elements are formed so as to completely fill the openings formed by the previous etch step, to make contact with the phase change elements 130

While the present invention is disclosed by reference to the preferred embodiments and examples detailed above, it is to be understood that these examples are intended in an illustrative rather than in a limiting sense. It is contemplated that modifications and combinations will readily occur to those skilled in the art, which modifications and combinations will be within the spirit of the invention and the scope of the following claims.

What is claimed is:

1. A memory device, comprising:
    a first electrode element having a top surface;
    a cap layer overlying the first electrode element, the cap layer having an outer surface with a lateral dimension;
    a programmable resistive element having an outer surface with a lateral dimension, a bottom surface in contact with the top surface of the first electrode element, and a top surface in contact with a bottom surface of the cap layer, wherein the lateral dimension of the programmable resistive element is less than the lateral dimension of the cap layer;
    a second electrode element extending through an opening in the cap layer to contact the top surface of the programmable resistive element; and
    side walls comprising dielectric fill material, on the outer surface of the cap layer and extending to the top surface of the first electrode element, such that at least a portion of the outer surface of the programmable resistive element is spaced away from the side walls to define a gas-filled thermal isolation cell surrounding at least a portion of the outer surface of the programmable resistive element.

2. The memory device of claim 1, wherein the cap layer is composed of a dielectric fill material; the first electrode element is composed of a metal material; and the second electrode element is composed of TiN.

3. The memory device of claim 1, wherein the programmable resistive element comprises a combination of Ge, Sb, and Te.

4. The memory device of claim 1, wherein the programmable resistive element comprises a phase change element.

5. The memory device of claim 4, wherein the phase change element comprises a combination of two or more materials from the group of Ge, Sb, Te, Se, In, Ti, Ga, Bi, Sn, Cu, Pd, Pb, Ag, S, and Au.

6. The memory device of claim 1, wherein the thermal isolation cell contains air.

7. A memory device, comprising:
    a first electrode element, generally planar in form, having an inner contact surface;
    a cap layer, spaced from the first electrode element, the cap layer having a cylindrical lateral surface of a maximum lateral dimension;
    a programmable resistive element having a cylindrical lateral surface with a maximum lateral dimension and having a bottom surface in contact with the inner contact surface of the first electrode element, and a top surface in contact with a bottom surface of the cap layer, wherein the maximum lateral dimension of the programmable resistive element is less than the maximum lateral dimension of the cap layer;
    a second electrode element, including a filament extending through the cap layer to make contact with a top surface of the programmable resistive element;
    side walls composed of dielectric fill material, aligned with the cylindrical lateral surface of the cap layer and extending between the first electrode element and the cap layer, such that the programmable resistive element, the inner contact surface of the first electrode element and the side walls define a gas-filled thermal isolation cell surrounding at least a portion of the cylindrical lateral surface of the programmable resistive element; and
    a spacer element between the cap element and the second electrode, composed of SiN.

8. The memory device of claim 1, wherein the programmable resistance material is a colossal magnetoresistance material.

9. The memory device of claim 4, wherein the programmable resistive material comprises a combination of two or more materials from the group of $Ni_xO_y$; $Ti_xO_y$; $Al_xO_y$; $W_xO_y$; $Zn_xO_y$; $Zr_xO_y$; $Cu_xO_y$; where x:y=0.5:0.5.

10. The memory device of claim 1, wherein the programmable resistive material is a polymer material from the group TCNQ, PCBM, TCNQ with doping of Cu, $C_{60}$.

11. A memory array, comprising:
    a plurality of first electrode elements having respective top surfaces and arrayed along a first direction;
    a plurality of memory elements, separated by partitions, each memory element comprising:
        a cap layer overlying a corresponding first electrode element in the plurality of first electrode elements;
        a programmable resistive element having a bottom surface in contact with the top surface of the corresponding first electrode element and having a top surface in contact with a bottom surface of the cap layer, wherein a lateral dimension of the programmable resistive element is less than that of the corresponding first electrode element and the cap layer; and
        side walls comprising dielectric fill material, on an outer surface of the cap layer and extending to the top surface of the corresponding first electrode element, such that at least portion of an outer surface of the programmable resistive element is spaced away from the side walls to define a gas-filled thermal isolation cell; and
    a plurality of second electrode elements arrayed in a second direction, each second electrode element overlying memory elements in the plurality of memory elements, and extending through the cap layer of each of said memory elements to contact top surfaces of the programmable resistive element of each of said memory elements.

12. The memory device of claim 11, wherein the cap layers are composed of a dielectric fill material; the first electrode elements are composed of a metal material; and the second electrode elements are composed of TiN.

13. The memory device of claim 11, wherein the programmable resistive elements comprise a combination of Ge, Sb, and Te.

14. The memory device of claim 11, wherein the programmable resistive elements comprise a combination of two or more materials from the group of Ge, Sb, Te, Se, In, Ti, Ga, Bi, Sn, Cu, Pd, Pb, Ag, S, and Au.

15. The memory device of claim 11, wherein the thermal isolation cell contains air.

16. A memory array, comprising:
   a plurality of first electrode elements, generally planar in form, having an inner contact surface and arrayed mutually parallel in a first direction;
   a plurality of pillar-shaped memory elements, separated by partitions, each element comprising:
      a cap layer, spaced from the first electrode element;
      a phase change element having contact surfaces in contact with the first electrode contact surfaces and the cap layer, wherein the lateral dimension of the phase change element is less than that of the first electrode element and the cap layer; and
      side walls aligned with the cap layer, composed of dielectric fill material, extending between a first electrode elements and the cap layer, such that the phase change element, the contact surface of the first electrode element and the side walls define a gas-filled thermal isolation cell adjacent the phase change element;
   a plurality of second electrode elements arrayed mutually parallel in a direction generally orthogonal to the direction of the first electrode elements, each second electrode element spanning a plurality of memory elements, and having at each memory element a contact element extending through the cap layer to make contact with the phase change element; and
   a spacer element between the cap element and the second electrode, composed of SiN.

17. The memory device of claim 1, wherein the second electrode element has a lateral dimension at the top surface of the programmable resistive element less than that of the programmable resistive element.

18. The memory device of claim 1, wherein:
   the second electrode element contacts the top surface of the programmable resistive element at a first contact surface;
   the first electrode element contacts the bottom surface of the programmable resistive element at a second contact surface; and
   the first contact surface has a contact area less than that of the second contact surface.

19. The memory device of claim 1, wherein the programmable resistive element has a phase change region adjacent the second electrode element.

20. The memory device of claim 1, wherein the side walls have side wall surfaces extending above the cap layer, and further comprising a spacer element on the cap layer and on the sidewall surfaces of the side walls, the spacer element having an inner surface defining an opening aligned with the opening in the cap layer, and the second electrode element further within the opening in the spacer element.

* * * * *